US010998490B2

(12) United States Patent
Matsumoto et al.

(10) Patent No.: US 10,998,490 B2
(45) Date of Patent: May 4, 2021

(54) MAGNETIC ELEMENT

(71) Applicant: National Institute of Advanced Industrial Science and Technology, Chiyoda-ku (JP)

(72) Inventors: Rie Matsumoto, Tsukuba (JP); Takayuki Nozaki, Tsukuba (JP); Shinji Yuasa, Tsukuba (JP); Hiroshi Imamura, Tsukuba (JP)

(73) Assignee: National Institute of Advanced Industrial Science and Technology, Chiyoda-ku (JP)

( * ) Notice: Subject to any disclaimer, the term of this patent is extended or adjusted under 35 U.S.C. 154(b) by 0 days.

(21) Appl. No.: 16/606,927

(22) PCT Filed: Apr. 5, 2018

(86) PCT No.: PCT/JP2018/014605
§ 371 (c)(1),
(2) Date: Oct. 21, 2019

(87) PCT Pub. No.: WO2018/198713
PCT Pub. Date: Nov. 1, 2018

(65) Prior Publication Data
US 2020/0052193 A1    Feb. 13, 2020

(30) Foreign Application Priority Data

Apr. 28, 2017  (JP) .............................. JP2017-090398

(51) Int. Cl.
*G11C 11/00*  (2006.01)
*H01L 43/02*  (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC .............. G11C 11/161; G11C 11/1675; G11C 11/1659; H01L 27/228; H01L 43/02; H01L 43/10
See application file for complete search history.

(56) References Cited

U.S. PATENT DOCUMENTS 8,279,666 B2 * 10/2012 Dieny ..................... H01L 43/08
365/171
8,787,077 B2 *  7/2014 Saida ..................... G11C 11/161
365/158
(Continued)

FOREIGN PATENT DOCUMENTS

JP    2013-45840 A    3/2013
JP    2014-502423 A   1/2014
(Continued)

OTHER PUBLICATIONS

International Search Report dated Jun. 26, 2018 in PCT/JP2018/014605 filed on Apr. 5, 2018.
(Continued)

*Primary Examiner* — Pho M Luu
(74) *Attorney, Agent, or Firm* — Oblon, McClelland, Maier & Neustadt, L.L.P.

(57) ABSTRACT

A magnetic element includes a first magnetic layer and a first nonmagnetic layer. An angle $\theta_0$ between a first direction and the magnetization direction of the first magnetic layer satisfies $0°<\theta_0<90°$ or $90°<\theta_0<180°$ in a state in which neither a voltage nor a magnetic field is substantially applied to the first magnetic layer; and the first direction is from the first nonmagnetic layer toward the first magnetic layer. A resistance·area of the first nonmagnetic layer is 10 $\Omega\mu m^2$ or more.

15 Claims, 12 Drawing Sheets

(51) Int. Cl.
*G11C 11/16* (2006.01)
*H01L 27/22* (2006.01)
*H01L 43/10* (2006.01)

(52) U.S. Cl.
CPC ........ *G11C 11/1675* (2013.01); *H01L 27/228* (2013.01); *H01L 43/10* (2013.01)

(56) References Cited

U.S. PATENT DOCUMENTS

| | | | |
|---|---|---|---|
| 10,651,371 B2* | 5/2020 | Okamoto | H01L 43/02 |
| 2010/0284217 A1 | 11/2010 | Ogimoto et al. | |
| 2011/0049659 A1* | 3/2011 | Suzuki | B82Y 25/00 |
| | | | 257/421 |
| 2012/0294078 A1 | 11/2012 | Kent et al. | |
| 2014/0085969 A1 | 3/2014 | Saida et al. | |
| 2014/0169085 A1 | 6/2014 | Wang et al. | |
| 2015/0085569 A1 | 3/2015 | Nozaki et al. | |
| 2016/0358973 A1 | 12/2016 | Katine | |
| 2017/0084322 A1 | 3/2017 | Wang et al. | |
| 2018/0151214 A1 | 5/2018 | Matsumoto et al. | |

FOREIGN PATENT DOCUMENTS

| | | |
|---|---|---|
| JP | 2014-67929 A | 4/2014 |
| JP | 2016-225633 A | 12/2016 |
| WO | WO2009/078202 A1 | 6/2009 |
| WO | WO 2009/133650 A1 | 11/2009 |
| WO | WO2016/186178 A1 | 11/2016 |

OTHER PUBLICATIONS

Sun, J. Z., "Resistance-area product and size dependence of spin-torque switching efficiency in CoFeB—MgO based magnetic tunnel junctions", Physical Review B, vol. 96, 2017, 14 total pages.

Matsumoto, R. et al., "Voltage-Induced Precessional Switching at Zero-Bias Magnetic Field in a Conically Magnetized Free Layer", Physical Review Applied, vol. 9, 2018, 8 total pages.

* cited by examiner

MAGNETIC ELEMENT

TECHNICAL FIELD

Embodiments of the invention relate to a magnetic element.

BACKGROUND ART

A magnetic element is known in which the magnetization direction of a magnetic layer is changed according to information to be stored. It is desirable to obtain stable operations of the magnetic element.

PRIOR ART DOCUMENT

Patent Document

[Patent Document 1] International Publication 2009/133650
[Patent Document 2] JP 2014-67929 A (Kokai)

SUMMARY OF INVENTION

Problem to be Solved by the Invention

An embodiment of the invention provides a magnetic element in which the operational stability can be improved.

Means for Solving the Problem

According to an embodiment of the invention, a magnetic element includes a first magnetic layer and a first nonmagnetic layer. An angle $\theta_0$ between a first direction and the magnetization direction of the first magnetic layer satisfies $0°<\theta_0<90°$ or $90°<\theta_0<180°$ in a state in which neither a voltage nor a magnetic field is substantially applied to the first magnetic layer; and the first direction is from the first nonmagnetic layer toward the first magnetic layer. A resistance·area of the first nonmagnetic layer is 10 $\Omega \cdot \mu m^2$ or more.

Effects of the Invention

According to an embodiment of the invention, a magnetic element can be provided in which the operational stability can be improved.

EMBODIMENTS OF INVENTION

Figure 1:
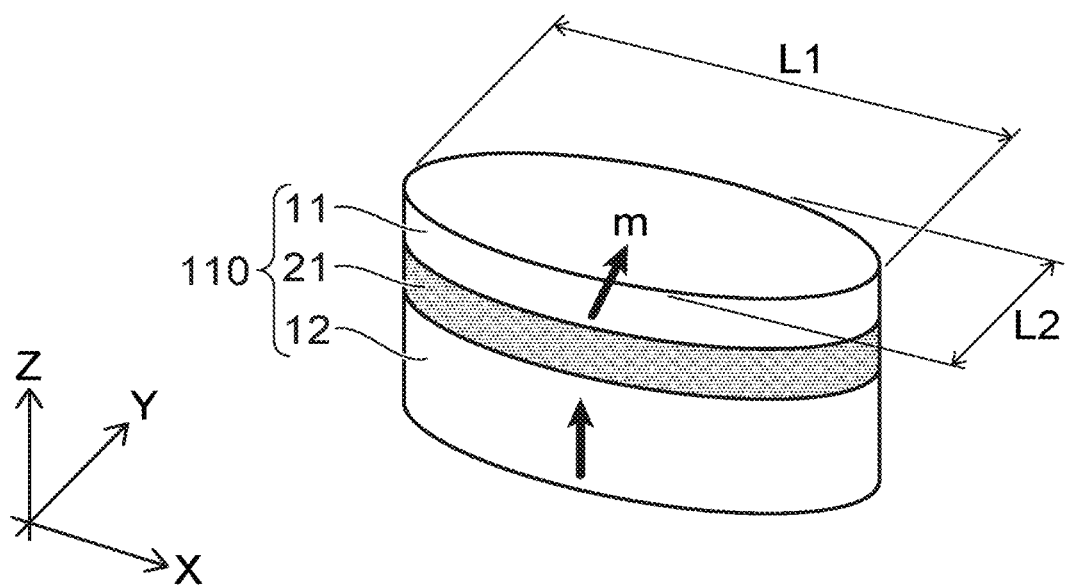
FIG. 1 is a schematic perspective view illustrating a magnetic element according to an embodiment.

Various embodiments of the invention are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a schematic perspective view illustrating a magnetic element according to an embodiment.

Figure 2A:
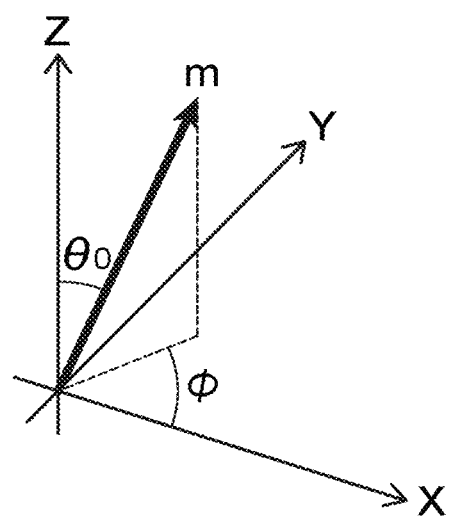
FIG. 2A and FIG. 2B are schematic views illustrating characteristics of the magnetic element according to the embodiment.
Figure 2B:
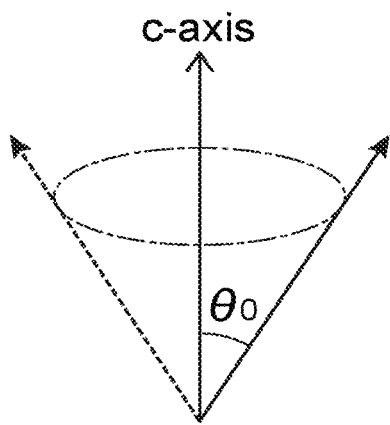

FIG. 2A and FIG. 2B are schematic views illustrating characteristics of the magnetic element according to the first embodiment.

Figure 3:
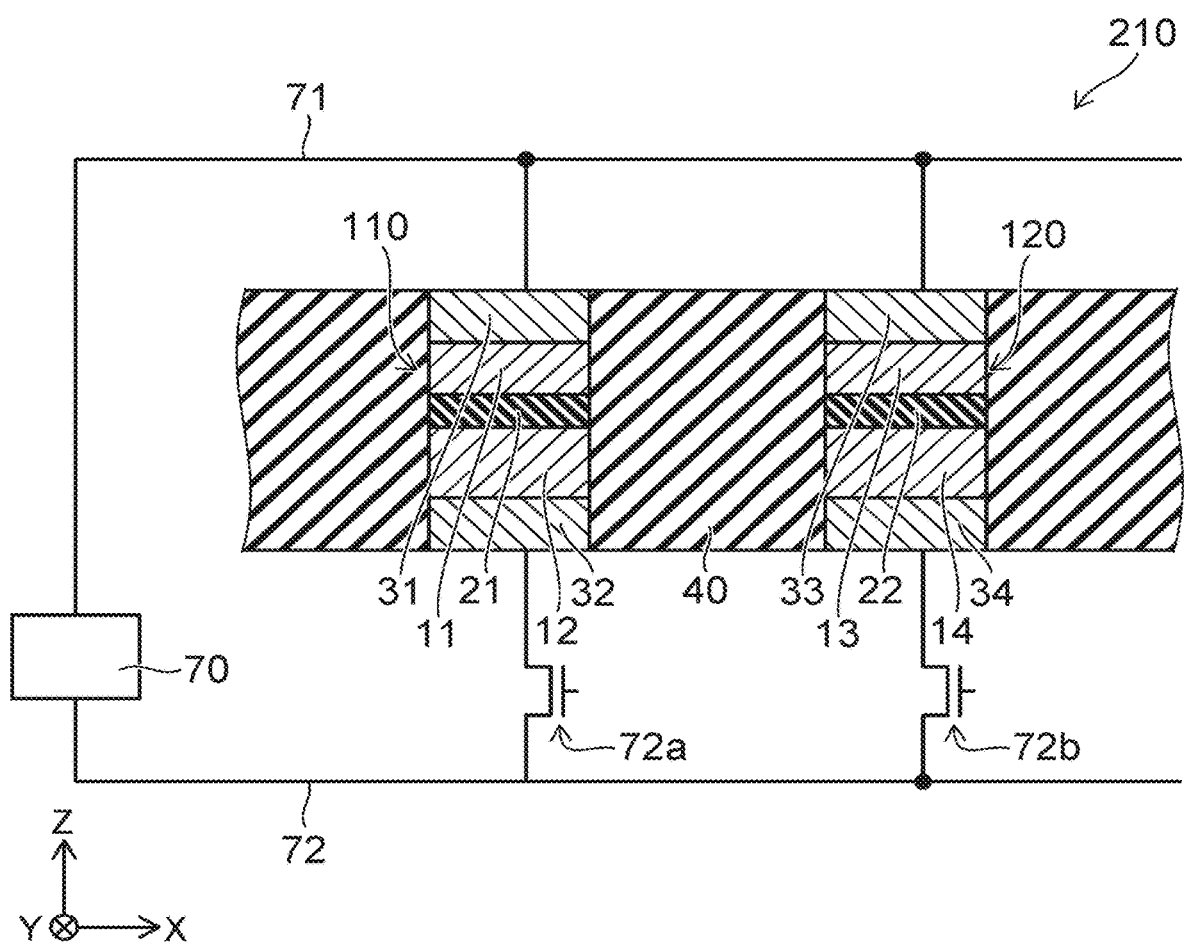
FIG. 3 is a schematic cross-sectional view illustrating the magnetic element according to the embodiment.

FIG. 3 is a schematic cross-sectional view illustrating the magnetic element according to the embodiment.

A first magnetic element 110 according to the embodiment includes a first magnetic layer 11, a first nonmagnetic layer 21, and a second magnetic layer 12.

A first direction from the first nonmagnetic layer 21 toward the first magnetic layer 11 is taken as a Z-axis direction. One direction perpendicular to the Z-axis direction is taken as an X-axis direction. A direction perpendicular to the Z-axis direction and the X-axis direction is taken as a Y-axis direction. An angle that is measured from the Z-axis is taken as a polar angle θ; and an angle in the XY plane measured from the X-axis is taken as an azimuth angle ϕ.

The second magnetic layer 12 is provided at the side opposite to the first magnetic layer 11 with the first nonmagnetic layer 21 interposed. The first nonmagnetic layer 21 is positioned between the first magnetic layer 11 and the second magnetic layer 12 in the Z-axis direction. For example, the first magnetic layer 11, the first nonmagnetic layer 21, and the second magnetic layer 12 spread parallel to the X-Y plane.

An anisotropic magnetic field $H_k$ of the first magnetic layer 11 in a plane crossing the Z-axis direction satisfies $H_k \neq 0$. For example, as illustrated in FIG. 1, a length L1 of the first magnetic layer 11 in the X-axis direction is different from a length L2 of the first magnetic layer 11 in the Y-axis direction. Thereby, a shape anisotropic magnetic field is generated in the first magnetic layer 11 so that $H_k \neq 0$.

As illustrated in FIG. 2A, the angle $\theta_0$ between the Z-axis direction and a magnetization direction m of the first magnetic layer 11 in a state in which neither a voltage nor a magnetic field is substantially applied to the first magnetic layer 11 satisfies $0°<\theta_0<90°$ or $90°<\theta_0<180°$ and is oblique to the Z-axis direction. The angle ϕ between the X-axis direction and the magnetization direction m is the same azimuth angle as $H_k$ in the case where $H_k \neq 0$.

The first magnetic layer 11 includes a ferromagnetic material. For example, the c-axis of the ferromagnetic material included in the first magnetic layer 11 is aligned with the Z-axis direction. For example, in the state of $H_k$=0 before fine patterning, the magnetization direction m of the first magnetic layer 11 is at some position on a circular conic surface tilted at the angle $\theta_0$ with respect to the c-axis (the Z-axis direction) as illustrated in FIG. 2B. Such a magnetization state satisfying $0°<\theta_0<90°$ or $90°<\theta_0<180°$ is called a cone magnetization state.

The first nonmagnetic layer 21 is, for example, a tunnel insulating layer. It is favorable for the resistance·area (RA: Resistance area product) of the first nonmagnetic layer 21 to be $\Omega \cdot \mu m^2$ or more. Thereby, for example, low power consumption is obtained in the voltage write operation. For example, the information that relates to the resistance-area of the first nonmagnetic layer 21 is obtained from the measurement results of the resistance of the element and the measurement results of the size of the element from a SEM (Scanning Electron Microscope), a TEM (Transmission Electron Microscope), etc.

The resistance·area of the first nonmagnetic layer 21 may be, for example, greater than 20 $\Omega \cdot \mu m^2$. Thereby, for example, low power consumption that is ½ of the case of a current write operation is obtained. The resistance·area of the first nonmagnetic layer 21 may be, for example, 100 $\Omega \cdot \mu m^2$ or more. Thereby, for example, an even lower power consumption that is 1/10 of the case of a current write operation is obtained. The resistance·area of the first nonmagnetic layer 21 may be, for example, 500 $\Omega \cdot \mu m^2$ or more. Thereby, for example, even lower power consumption that is 1/50 of the case of a current write operation is obtained. The energy that is necessary to write increases abruptly when the resistance-area of the first nonmagnetic layer 21 becomes 20 $\Omega \cdot \mu m^2$ or less. The increase of the energy necessary to write accelerates further when the resistance·area of the first nonmagnetic layer 21 becomes less than 10 $\Omega \cdot \mu m^2$.

On the other hand, in a voltage read operation, the time that is necessary to read lengthens as the resistance·area of the first nonmagnetic layer 21 increases. For example, the time that is necessary to read lengthens and is respectively 2 times, 10 times, and 50 times the case where the resistance·area of the first nonmagnetic layer 21 is 20 $\Omega \cdot \mu m^2$, 100 $\Omega \cdot \mu m^2$, and 500 $\Omega \cdot \mu m^2$. Therefore, from the perspective of high-speed reading, it is favorable for the resistance·area of the first nonmagnetic layer 21 to be lower than the values recited above. In an actual magnetic memory device, it is sufficient to use an optimal resistance·area of the first nonmagnetic layer 21 for realizing both the power consumption and the read speed necessary for the individual application.

In the example illustrated in FIG. 3, the first magnetic element 110 is included in a magnetic memory device 210. The magnetic memory device 210 further includes, for example, a second magnetic element 120, a first conductive layer 31, a second conductive layer 32, a third conductive layer 33, a fourth conductive layer 34, an insulating portion 40, a controller 70, a first interconnect 71, and a second interconnect 72. The second magnetic element 120 includes a third magnetic layer 13, a fourth magnetic layer 14, and a second nonmagnetic layer 22.

The third magnetic layer 13 is separated from the first magnetic layer 11 in the X-axis direction. For example, the third magnetic layer 13 has a structure similar to the first magnetic layer 11. In other words, the anisotropic magnetic field of the third magnetic layer 13 in a plane crossing the Z-axis direction is greater than 0. The angle between the Z-axis direction and the magnetization direction of the third magnetic layer 13 is greater than 0° and less than 90° or greater than 90° and less than 180° in a state in which neither a voltage nor a magnetic field is substantially applied to the third magnetic layer 13.

The fourth magnetic layer 14 is separated from the second magnetic layer 12 in the X-axis direction. The second nonmagnetic layer 22 is provided between the third magnetic layer 13 and the fourth magnetic layer 14 in the Z-axis direction.

The first magnetic layer 11 is provided between the first conductive layer 31 and the first nonmagnetic layer 21 in the Z-axis direction. For example, the first conductive layer 31 contacts the first magnetic layer 11. The second magnetic layer 12 is provided between the second conductive layer 32 and the first nonmagnetic layer 21 in the Z-axis direction.

The third magnetic layer 13 is provided between the third conductive layer 33 and the second nonmagnetic layer 22 in the Z-axis direction. For example, the third conductive layer 33 contacts the third magnetic layer 13. The fourth magnetic layer 14 is provided between the fourth conductive layer 34 and the second nonmagnetic layer 22 in the Z-axis direction.

A faint magnetic field such as geomagnetism, etc., in a range that substantially does not affect the magnetization directions of the first magnetic layer 11 and the third magnetic layer 13 may be applied to the magnetic memory device 210. Here, the state in which a faint magnetic field such as geomagnetism or the like is applied also is included in the state of a magnetic field being substantially not applied.

The insulating portion 40 is provided between the first magnetic element 110 and the second magnetic element 120 in the X-axis direction.

The first conductive layer 31 and the third conductive layer 33 are electrically connected to the first interconnect 71. The second conductive layer 32 and the fourth conductive layer 34 are electrically connected to the second interconnect 72. For example, a first switch 72a is provided between the second conductive layer 32 and the second interconnect 72. For example, a second switch 72b is provided between the fourth conductive layer 34 and the second interconnect 72. The first switch 72a and the second switch 72b are, for example, select transistors. Thus, the state in which a switch or the like is provided in the current path also is included in the state of being electrically connected. The first switch 72a and the second switch 72b may be provided respectively between the first conductive layer 31 and the first interconnect 71 and between the third conductive layer 33 and the first interconnect 71.

The controller 70 applies the voltage between the first interconnect 71 and the second interconnect 72 and selectively applies the voltage to the first magnetic element 110 or the second magnetic element 120 by setting the first switch 72a or the second switch 72b ON. When a voltage having the appropriate polarity is applied to the first magnetic element 110, the magnetization direction of the first magnetic layer 11 precesses around the X-axis direction at the center; and the Z-axis direction component of the magnetization direction repeats a positive and negative reversal. The magnetization direction of the first magnetic layer 11 can be controlled to the desired direction by appropriately controlling the application time of the voltage to the first magnetic element 110. In other words, in the magnetic memory device 210, it is possible to perform bidirectional information writing by applying a unipolar voltage to the first magnetic layer 11 via the first nonmagnetic layer 21.

According to the embodiment, the angle $\theta_0$ between the Z-axis direction and the magnetization direction m of the first magnetic layer 11 satisfies $0°<\theta_0<90°$ or $90°<\theta_0<180°$. When the voltage is applied to the first magnetic layer 11, for example, torque that changes the magnetization direction of the first magnetic layer 11 is applied by the anisotropic magnetic field $H_k$ of the first magnetic layer 11. As a result, the magnetization direction of the first magnetic layer 11 changes when the voltage is applied in a state in which there is substantially no external magnetic field.

Accordingly, it is unnecessary for the magnetic memory device 210 according to the embodiment to include a magnetic layer for applying a magnetic field in the in-plane direction to the first magnetic layer 11, etc. For example, the magnetic memory device 210 does not include a magnetic layer having an easy magnetization axis in the in-plane direction. Because a configuration for applying a magnetic field to the first magnetic layer 11 is not included, the manufacture of the magnetic memory device 210 is easy. Further, the fluctuation of the change of the magnetization direction of the first magnetic layer 11 based on the fluctuation of the intensity of the external magnetic field can be suppressed; therefore, the operational stability of the magnetic memory device 210 can be improved.

For example, the magnetization direction of each magnetic layer included in the magnetic memory device 210 described above can be observed using spin-polarized SEM.

Specific examples of the components will now be described.

The first magnetic layer 11, the second magnetic layer 12, the third magnetic layer 13, and the fourth magnetic layer 14 include, for example, at least one selected from the group consisting of Fe, Co, Ni, Cr, Mn, Gd, Nd, Sm, and Tb. The thicknesses of the first magnetic layer 11, the second magnetic layer 12, the third magnetic layer 13, and the fourth magnetic layer 14 each are, for example, not less than 0.5 nm and not more than 10 nm.

Or, the first magnetic layer 11 and the third magnetic layer 13 may include first regions and second regions. The first region includes Co; and the second region includes at least one selected from the group consisting of Pt and Pd. In such a case, the first region is provided between the first nonmagnetic layer 21 and the second region.

Or, the first magnetic layer 11 and the third magnetic layer 13 may include multiple first regions and multiple second regions provided alternately in the Z-axis direction. In such a case, it is desirable for the first region to have a hexagonal close-packed structure (hcp) structure or a face-centered cubic (fcc) (111) structure. It is favorable for the second region to have a fcc (111) structure. Or, the first region may have a fcc (001) structure; and the second region may have an fcc (001) structure. It is favorable for the thickness (the length in the Z-axis direction) of one layer of the first region stacked on the second region including Pt to correspond to the size of 10 to 15 Co atoms. It is favorable for the thickness of one layer of the first region stacked on the second region including Pd to correspond to the size of 4.5 to 6 Co atoms.

The first region may include Co; and the second region may include Pt. For example, in such a case, the thickness of the first region is not less than 0.9 nm and not more than 1.1 nm; and the thickness of the second region is 2 nm. As an example, eight first regions and eight second regions are provided alternately in the Z-axis direction. Or, the first region may be Co that is 1 or 2 atomic layers thick; and the second region may be Pt that is 1 or 2 atomic layers thick. In such a case, for example, several layers to several tens of layers of the first region and the second region may be provided alternately in the Z-axis direction.

Or, the first magnetic layer 11 and the third magnetic layer 13 may include Co having an hcp structure.

Or, the first magnetic layer 11 and the third magnetic layer 13 may be configured by stacking a first magnetic film having an easy magnetization axis in the Z-axis direction, and a second magnetic film having an easy magnetization axis in the in-plane direction. In such a case, it is favorable for the first magnetic film and the second magnetic film to be relatively thin so that the magnetization direction of the first magnetic layer 11 and the third magnetic layer 13 as an entirety is tilted from the Z-axis direction.

The magnetization directions of the second magnetic layer 12 and the fourth magnetic layer 14 do not change easily. The magnetization directions of the first magnetic layer 11 and the third magnetic layer 13 change easily compared to the magnetization directions of the second magnetic layer 12 and the fourth magnetic layer 14.

The first nonmagnetic layer 21 and the second nonmagnetic layer 22 include an oxide, a nitride, or a fluoride including at least one selected from the group consisting of Mg, Si, Al, Ti, Zr, Hf, Ta, Zn, Sr, and Ba. The thicknesses of the first nonmagnetic layer 21 and the second nonmagnetic layer 22 each are, for example, not less than 0.5 nm and not more than 4 nm.

The first conductive layer 31, the second conductive layer 32, the third conductive layer 33, and the fourth conductive layer 34 are nonmagnetic. The first conductive layer 31, the second conductive layer 32, the third conductive layer 33, and the fourth conductive layer 34 include, for example, at least one selected from the group consisting of Ta, Ru, W, Ir, Au, Ag, Cu, Al, Cr, Pt, and Pd. The thicknesses of the first conductive layer 31, the second conductive layer 32, the third conductive layer 33, and the fourth conductive layer 34 each are, for example, not less than 1 nm and not more than 200 nm. More favorably, the thicknesses of these conductive layers are longer than the length L1 or the length L2 of the first magnetic layer 11 and are not more than 200 nm. Good flatness and a low resistance value are obtained thereby.

The insulating portion 40 includes, for example, a nonmagnetic insulating compound. The insulating compound is, for example, an oxide, a nitride, or a fluoride of at least one element selected from the group consisting of Si, Al, Ti, Mg, and Ta.

The first magnetic layer 11 will now be described in detail.

Figure 4A:
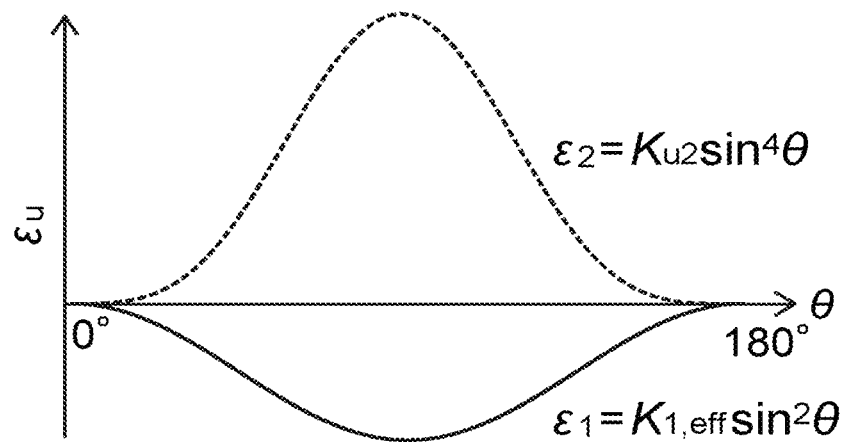
FIG. 4A and FIG. 4B are schematic views illustrating characteristics of the first magnetic layer.
Figure 4B:
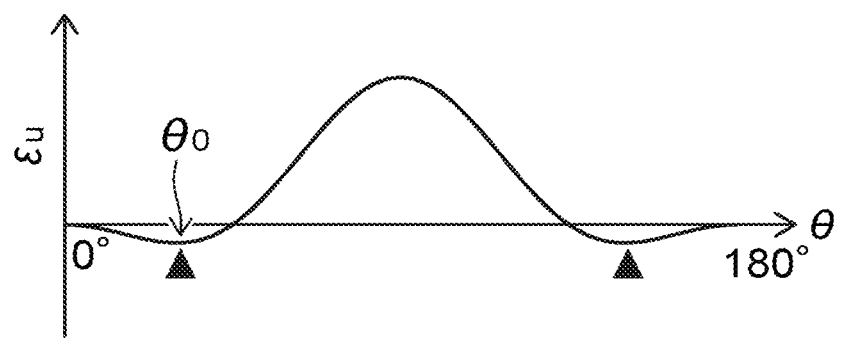
Figure 5:
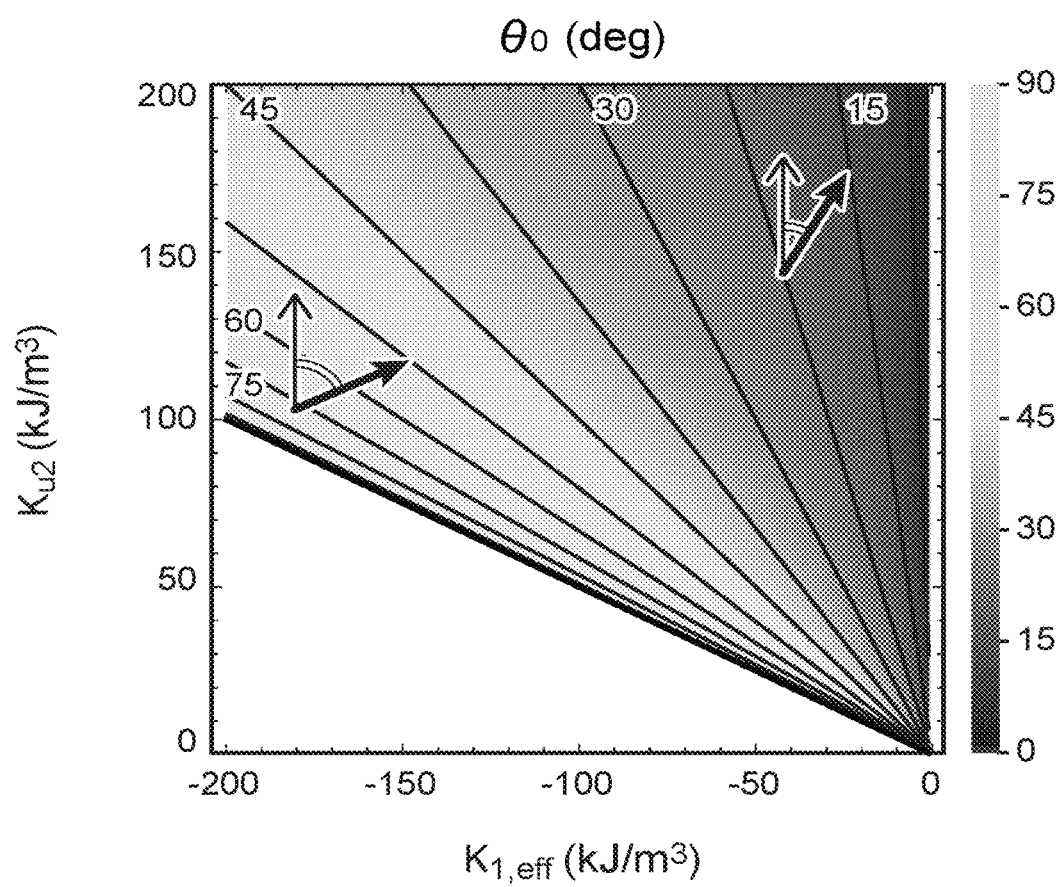
FIG. 5 is a schematic view illustrating characteristics of the first magnetic layer.

FIG. 4A, FIG. 4B, and FIG. 5 are schematic views illustrating characteristics of the first magnetic layer.

FIG. 4A, FIG. 4B, and FIG. 5 illustrate the characteristics of the first magnetic layer 11 in a state in which a voltage is substantially not applied to the first magnetic element 110.

In FIG. 4A and FIG. 4B, the horizontal axis is the angle $\theta$ between the magnetization direction of the first magnetic layer 11 and the Z-axis direction; and the vertical axis is an anisotropic energy $\varepsilon_u$. In FIG. 4A, the solid line illustrates a first-order term $\varepsilon_1$ of the anisotropic energy; and the broken line illustrates a second-order term $\varepsilon_2$ of the anisotropic energy. $K_{1,eff}$ of the first-order term is the effective first-order anisotropy constant. For $K_{1,eff}$, the contribution of the demagnetization energy is subtracted from a uniaxial first-order anisotropy constant $K_{u1}$. $K_{u2}$ of the second-order term is the uniaxial second-order anisotropy constant. FIG. 4B illustrates the sum of the first-order term $\varepsilon_1$ and the second-order term $\varepsilon_2$ of the anisotropic energy illustrated in FIG. 4A.

In the first magnetic layer 11 as illustrated in FIG. 4B, multiple angles θ exist where the anisotropic energy ε_u is a minimum. Specifically, the angle θ where the anisotropic energy ε_U is a minimum exists where 0°<θ<90° and 90°<θ<180°. The angle θ where ε_u is a minimum is represented as θ_0. In other words, the magnetization direction of the first magnetic layer 11 is tilted from the Z-axis direction in a state in which neither a voltage nor a magnetic field is substantially applied to these magnetic layers.

FIG. 5 shows, as a contour diagram, the dependence on $K_{1,eff}$ and $K_{u2}$ of the angle θ_0 between the magnetization direction of the first magnetic layer 11 and the Z-axis direction. In FIG. 5, the horizontal axis on the lower side is the effective first-order anisotropy constant $K_{1,eff}$; and the vertical axis is the uniaxial second-order anisotropy constant $K_{u2}$. The color bar on the right side illustrates the magnitude of θ_0. Although θ_0 also can be 90°<θ_0≤180°, the range of 0°≤θ_0≤90° is focused on in the display of FIG. 5. Also, because θ_0 and 360°−θ_0 are equivalent, a description is omitted for the case of 180°<θ_0≤360°.

FIG. 5 illustrates that 0°<θ_0<90° is satisfied when the first-order anisotropy constant satisfies $K_{1,eff}$<0 and the second-order anisotropy constant satisfies $K_{u2}$>−(½)$K_{1,eff}$. In other words, the cone magnetization state of the first magnetic layer 11 is obtained by satisfying these conditions.

As θ_0 approaches 90°, processional switching easily occurs more stably as described below; and stable writing is possible. For example, relatively stable writing is possible in the case where 5°<θ_0<90° or 90°<θ_0≤175°. More stable writing is possible in the case where 15°≤θ_0<90° or 90°<θ_0≤165°. More stable writing is possible in the case where 30°≤θ_0<90° or 90°<θ_0≤150°. Yet even more stable writing is possible in the case where 45°≤θ_0<90° or 90°<θ_0≤135°.

On the other hand, the magnitude of the output signal when reading is proportional to the absolute value of cos θ_0. Therefore, as θ_0 approaches 0° or 180°, the read output signal increases; and faster reading is possible. Therefore, from the perspective of high-speed reading, for example, relatively high-speed reading is possible in the case where 0°<θ_0≤60° or 120°≤θ_0<180°. Faster reading is possible in the case where 0°<θ_0≤45° or 135°≤θ_0<180°. Even faster reading is possible in the case where 0°<θ_0≤30° or 150°≤θ_0<180°. Yet even faster reading is possible in the case where 0°<θ_0≤15° or 165°≤θ_0<180°.

In the magnetic memory device 210, it is sufficient to adjust the materials and the structures of the components to realize θ_0 to provide good balance between the write stability and the read speed necessary for each application.

EXAMPLE

FIG. 6 to FIG. 11 are figures illustrating simulation results relating to the first magnetic layer.

Here, a magnetic energy density $ε^{(0)}$ of the first magnetic layer 11 in a state in which a voltage substantially is not applied to the magnetic memory device 210 is illustrated in the following "Formula 1." Here, μ_0 is the permeability; and M_s is the saturation magnetization. ($N_x$, $N_y$, $N_z$) are demagnetizing factors; ($m_x$, $m_y$, $m_z$) are unit magnetization vectors; and the suffixes x, y, and z respectively illustrate the X-axis direction component, the Y-axis direction component, and the Z-axis direction component. ($m_x$, $m_y$, $m_z$) and (θ, φ) have the relationship ($m_x$, $m_y$, $m_z$)=(sin θ cos φ, sin θ sin φ, cos θ). $K_{u1}^{(0)}$ and $K_{u2}^{(0)}$ are respectively first and second-order anisotropy constants in a state in which a voltage substantially is not applied. The magnetic energy density ε of the first magnetic layer 11 in a state in which a finite voltage is applied is illustrated in the following "Formula 2." $K_{u1}$ and $K_{u2}$ of "Formula 2" are respectively first and second-order anisotropy constants considering field effects. In the case where $K_{u1}$ and $K_{u2}$ change linearly with respect to an electric field E, $K_{u1}$ and $K_{u2}$ are expressed respectively in "Formula 3" and "Formula 4." E represents the electric field. $η_1$ and $η_2$ respectively represent the field effects for $K_{u1}$ and $K_{u2}$. $t_{11}$ represents the thickness of the first magnetic layer 11.

$$ε^{(0)} = \frac{1}{2}μ_0 M_s^2(N_x m_x^2 + N_y m_y^2 + N_z m_z^2) + \quad\quad\quad \text{[Formula 1]}$$
$$K_{u1}^{(0)}(1 - m_z^2) + K_{u2}^{(0)}(1 - m_z^2)^2$$

$$ε = \frac{1}{2}μ_0 M_s^2(N_x m_x^2 + N_y m_y^2 + N_z m_z^2) + \quad\quad\quad \text{[Formula 2]}$$
$$K_{u1}(1 - m_z^2) + K_{u2}(1 - m_z^2)^2$$

$$K_{u1} = \frac{K_{u1}^{(0)} t_{11} - η_1 E}{t_{11}} \quad\quad\quad \text{[Formula 3]}$$

$$K_{u2} = \frac{K_{u2}^{(0)} t_{11} - η_2 E}{t_{11}} \quad\quad\quad \text{[Formula 4]}$$

In the calculations of FIG. 6 to FIG. 11, the conditions of the first magnetic layer 11 were set as follows.

A thickness $t_{11}$ of the first magnetic layer 11 is $t_{11}$=1 [nm]; the length L1 of the first magnetic layer 11 is L1=60 [nm]; the length L2 of the first magnetic layer 11 is L2=46 [nm]; $N_x$=0.0242; $N_y$=0.0351; $N_z$=0.9407; the in-plane shape anisotropic magnetic field $H_k$=$M_s$ ($N_y$−$N_x$)=15.2 [kA/nn] (192 [Oe]); a junction area A of the surface of the first magnetic layer 11 contacting the first nonmagnetic layer 21 is A=π(L1/2)(L2/2) [nm²]; a saturation magnetization $M_s$ of the first magnetic layer 11 is $M_s$=1400 [kA/m] (=1400 [emu/cm³]); the first-order anisotropy constant $K_{u1}^{(0)}$=1109 [kJ/m³] for the magnetic anisotropy constant of the interface and the crystalline anisotropy of the first magnetic layer 11 when a voltage V applied to the first magnetic element 110 is V=0; the second-order anisotropy constant $K_{u2}^{(0)}$=135 [kJ/m³]; temperature 300 [K]; a thermal stability factor $Δ_0$=60.6; a thickness $t_{21n}$ of the first nonmagnetic layer 21 is $t_{21n}$=1 [nm]; the magnitude E of the electric field is E=V/$t_{21n}$ [V/nn]; and an external magnetic field $H_{ext}$=0 [kA/m]. The LLG equation is used in the calculation of the time evolution of the magnetization direction m=($m_x$, $m_y$, $m_z$).

Figure 6:
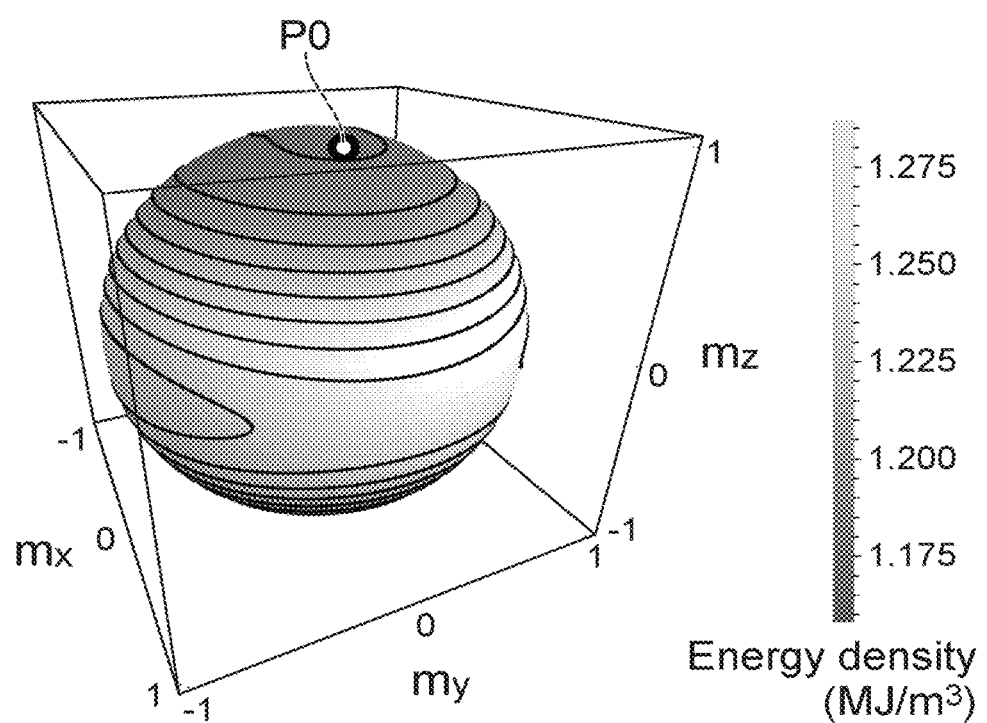
FIG. 6 is a figure illustrating simulation results relating to the first magnetic layer.

FIG. 6 is simulation results illustrating contour curves of the magnetic energy density $ε^{(0)}$ when the applied voltage V=0 for the conditions recited above. The energy density appears to be highest at the $m_z$=0 vicinity; and the energy density appears to decrease as $m_z$ approaches the −1 or 1 vicinity. More correctly, the energy density has a minimum value at ($m_x$, $m_y$, $m_z$)=($m_x^{(0)}$, $m_y^{(0)}$, $m_z^{(0)}$)=(sin θ_0 cos φ_0, sin θ_0 sin φ_0, cos θ_0); and $m_z^{(0)}$=cos θ_0 is 0.96 or −0.96. φ_0 is 0° or 180°. From the simulation results, it can be seen that the magnetization direction θ_0 of the first magnetic layer 11 is tilted 15.8° or 164.2° toward the X-axis direction from the Z-axis direction. In other words, it can be seen that a cone magnetization state is realized. In FIG. 6, for example, the magnetization in the initial magnetization state is oriented toward a direction P0. In FIG. 7 to FIG. 10, the initial magnetization direction was set to P0. P0 is illustrated by an open circle in FIG. 6, FIG. 7A, FIG. 8, FIG. 9, and FIG. 10A.

Figure 7A:
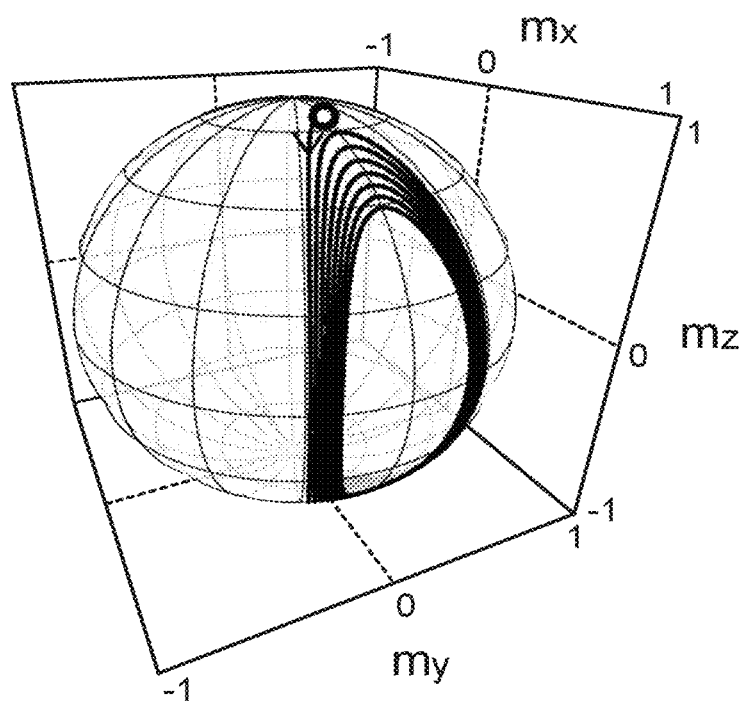
FIGS. 7A and 7B are figures illustrating simulation results relating to the first magnetic layer.
Figure 7B:
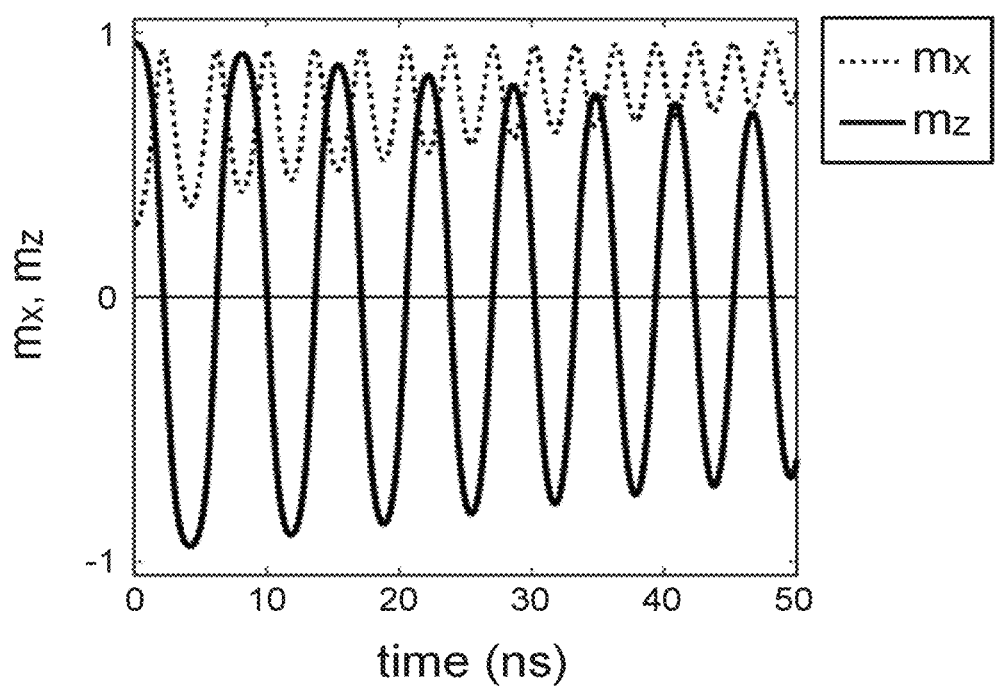

FIG. 7A and FIG. 7B illustrate simulation results when a voltage is applied to the first magnetic element 110 in the state illustrated in FIG. 6. FIG. 7A illustrates a trajectory of the magnetization direction. The trajectory in the time range of 0 ns to 50 ns is shown. In FIG. 7B, the horizontal axis is the time; and the vertical axis is the X-axis direction component $m_x$ and the Z-axis direction component $m_z$ of the magnetization direction. The solid line illustrates the Z-axis direction component $m_z$; and the broken line illustrates the X-axis direction component $m_x$. The conditions of the simulation were set as follows.

The field effect for $K_{u1}$ is $\eta_1 = -20$ fJ/(V·m); the field effect for $K_{u2}$ is $\eta_2 = 150$ fJ/(V·m); and the Gilbert damping constant factor of the first magnetic layer 11 is $\alpha = 0.005$.

When the voltage is applied as illustrated in FIG. 7A and FIG. 7B, the magnetization direction of the first magnetic layer 11 precesses around the X-axis direction at the center. When the voltage is applied as illustrated in FIG. 7B, it can be seen that the Z-axis direction component $m_z$ reverses periodically between positive and negative. In other words, from the simulation results, it can be seen that the magnetization direction of the first magnetic layer 11 reverses in the Z-axis direction due to the voltage applied even when the external magnetic field $H_{ext} = 0$ [kA/m].

Figure 8A:
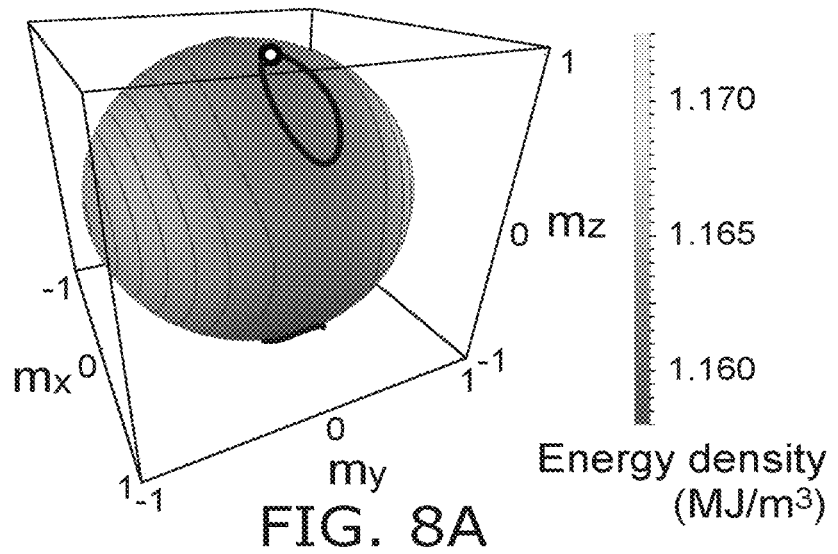
FIG. 8A to FIG. 8C are figures illustrating simulation results relating to the first magnetic layer.
Figure 8B:
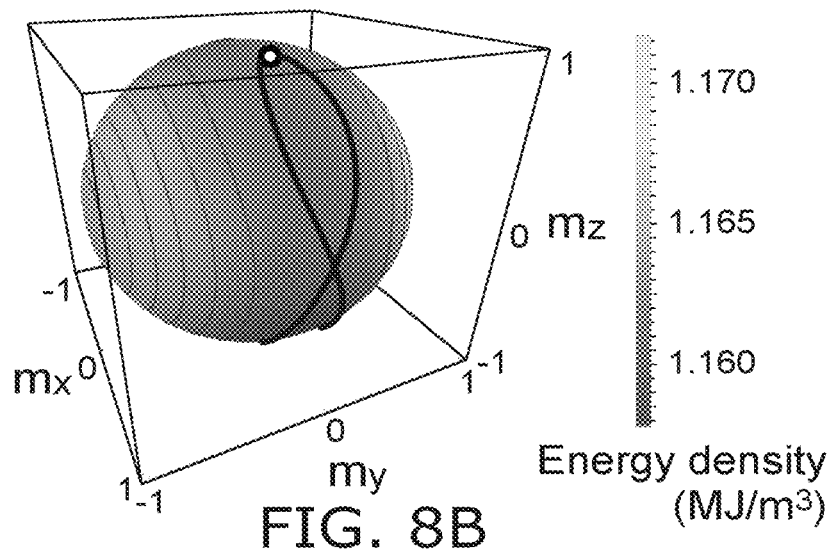
Figure 8C:
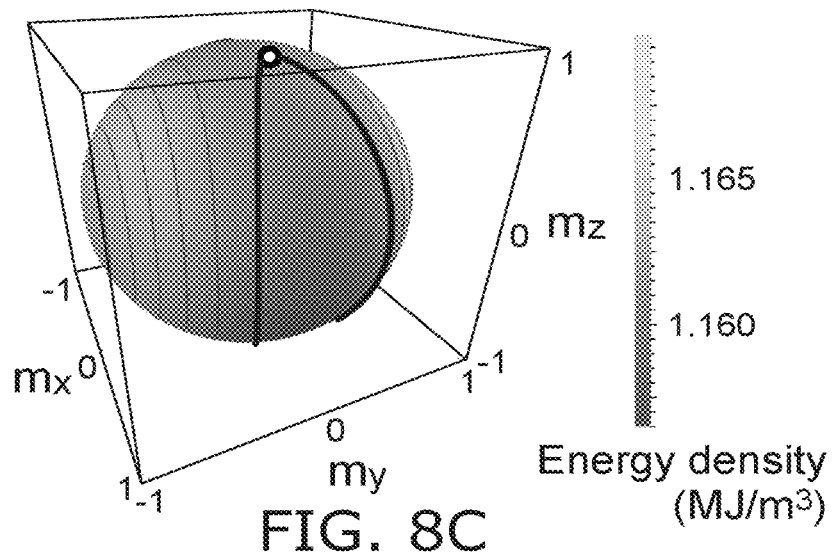

FIG. 8A to FIG. 8C are simulation results illustrating the change of the energy contour curves when the applied voltage is changed. Here, the energy is the magnetic energy density s illustrated in "Formula 2." Similarly to FIG. 7, the field effect for $K_{u1}$ was set to $\eta_1 = -20$ fJ/(V·m); and the field effect for $K_{u2}$ was set to $\eta_2 = 150$ fJ/(V·m).

FIG. 8A to FIG. 8C respectively illustrate the energy contour curves when the applied voltage V=0.88 V, 0.89 V, and 0.90 V. In each drawing, the thick solid line illustrates the energy contour curve equal to s at the initial magnetization direction.

In FIG. 8A, the energy contour curve that passes through the initial magnetization direction does not pass through the region where $m_z < 0$; and the magnetization direction does not reverse. In FIG. 8B and FIG. 8C, the energy contour curve that passes through the initial magnetization direction passes through the region where $m_z < 0$; and the magnetization direction can reverse. From this result, it can be seen that the threshold voltage at which the reversal of the magnetization direction occurs is $V_c = 0.89$ V. The threshold voltage $V_c$ can be determined as the voltage for which the energy contour curve that passes through the initial magnetization direction passes through $(m_x, m_y, m_z) = (1, 0, 0)$.

The threshold voltage $V_c$ also can be represented by the value of a threshold electric field $E_c$ multiplied by the thickness $t_{21n}$ of the first nonmagnetic layer 21. In other words, the magnetization direction of the first magnetic layer 11 can be reversed by applying a voltage larger than $V_c = E_c \cdot t_{21n}$ to the first magnetic element 110. The threshold electric field $E_c$ can be represented using the following "Formula 5" and "Formula 6."

$$E_c = \frac{K_{1,\textit{eff}}^{(0)} + K_{u2}^{(0)}\left(1 - \frac{K_{1,\textit{eff}}^{(0)}}{2K_{u2}^{(0)}}\right)}{\eta_1 + \eta_2\left(1 - \frac{K_{1,\textit{eff}}^{(0)}}{2K_{u2}^{(0)}}\right)} \cdot t_{11} \quad \text{[Formula 5]}$$

$$K_{1,\textit{eff}}^{(0)} = K_{u1}^{(0)} - \frac{1}{2}\mu_0 M_s^2 (N_z - N_x) \quad \text{[Formula 6]}$$

Figure 9:
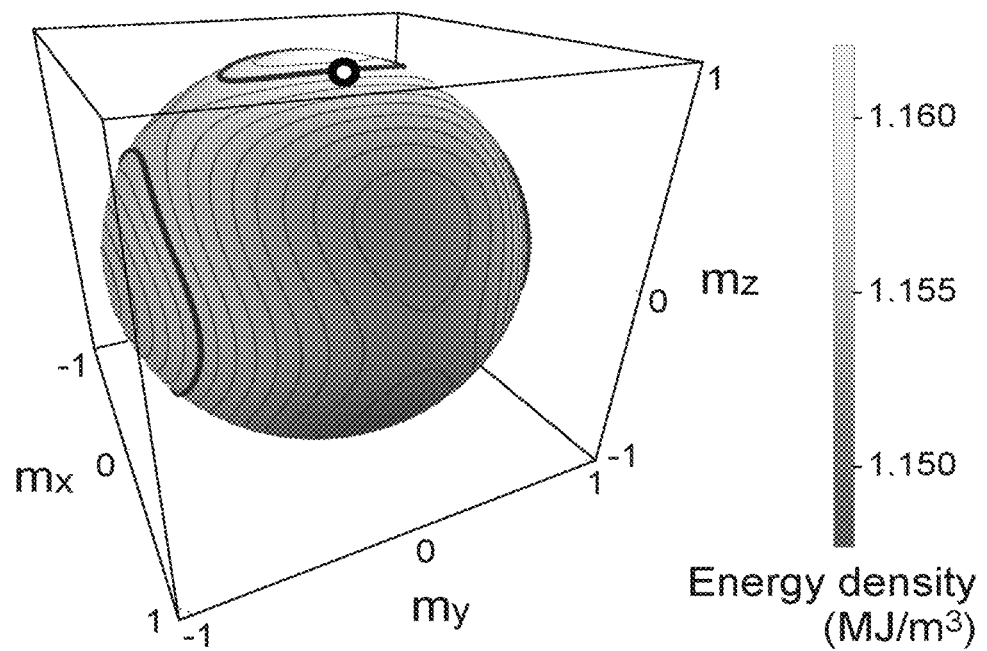
FIG. 9 is a figure illustrating other simulation results relating to the first magnetic layer.
Figure 10A:
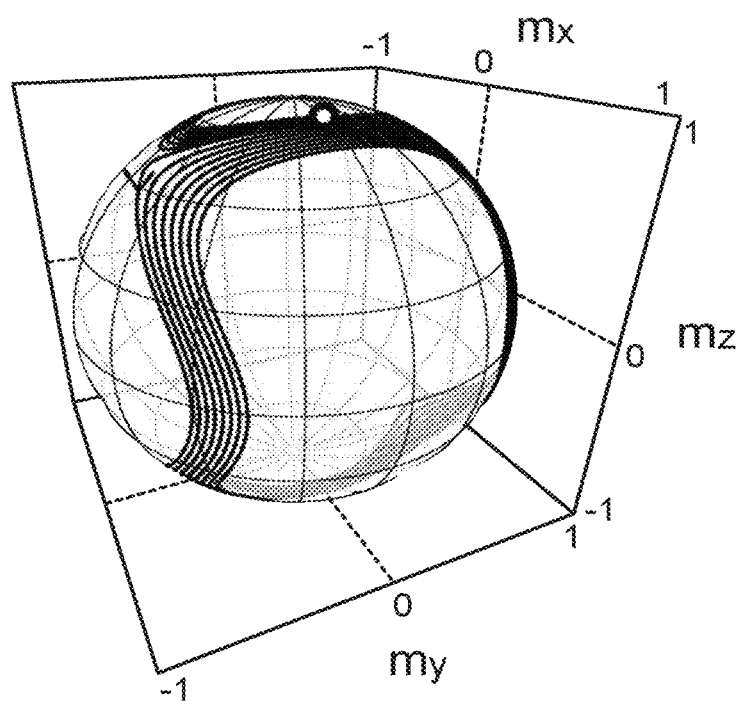
FIG. 10A and FIG. 10B are figures illustrating other simulation results relating to the first magnetic layer.
Figure 10B:
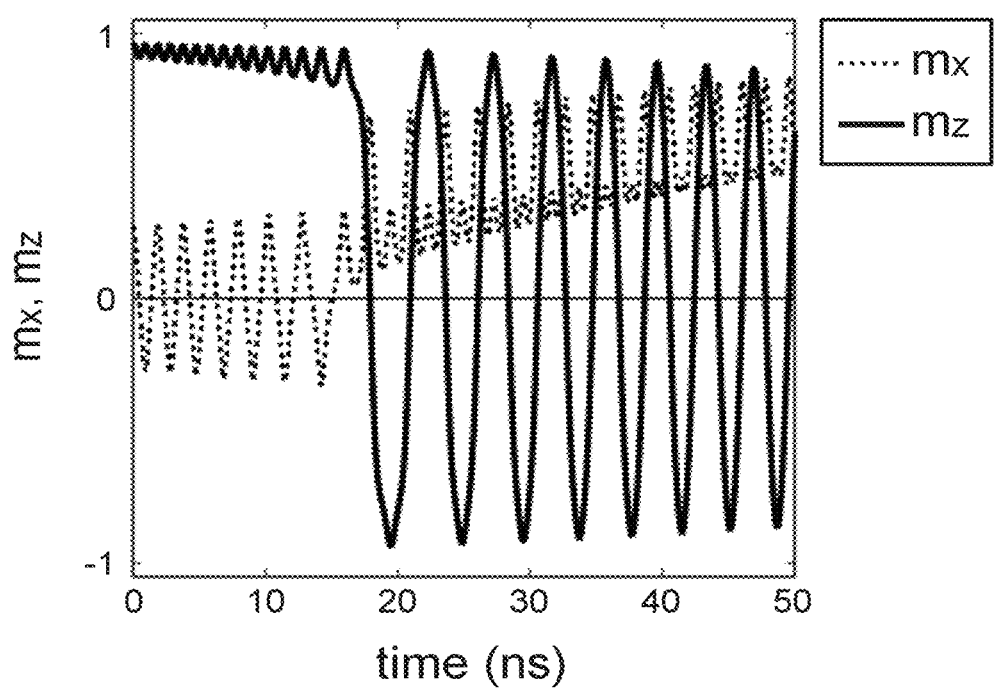

FIG. 9, FIG. 10A, and FIG. 10B are figures illustrating other simulation results relating to the first magnetic layer. The applied voltage is V=0.78 V. FIG. 10A shows a trajectory in the time range of 0 ns to 50 ns.

Here, the field effect $\eta_1$ for $K_{u1} = 10$ fJ/(V·m) and the field effect $\eta_2$ for $K_{u2} = 150$ fJ/(V·m) were set. In such a case, the threshold voltage that is estimated using "Formula 5" is 0.73 V; and the applied voltage is larger than the threshold voltage. Further, in FIG. 10, the Gilbert damping factor of the first magnetic layer 11 was set to $\alpha = 0.005$. Otherwise, the conditions are the same as those of the simulation results illustrated in FIG. 6 and FIG. 7. Accordingly, the contour diagram of the magnetic energy density $\varepsilon^{(0)}$ when the applied voltage V=0 is the same as FIG. 6.

FIG. 9 is simulation results illustrating the energy contour curves when the applied voltage V=0.78 V for the conditions recited above. Here, the energy is the magnetic energy density $\varepsilon$ illustrated in "Formula 2." The energy density is highest when $m_y = 1$ or $-1$ and $m_z = 0$. The thick solid line illustrates the energy contour curve equal to $\varepsilon$ for the initial magnetization direction.

In the simulation results as illustrated in FIG. 10A and FIG. 10B, it can be seen that the magnetization direction of the first magnetic layer 11 firstly rotates with the Z-axis direction at the center, and subsequently reverses in the Z-axis direction. In such a case, as illustrated in FIG. 10B, the time until the magnetization reversal occurs is slower than that of the simulation results illustrated in FIG. 7B. In other words, from the perspective of the reversal speed, the simulation results illustrated in FIG. 7 are more favorable than the simulation results illustrated in FIG. 10. The switching illustrated in FIG. 7 is called processional switching.

Figure 11:
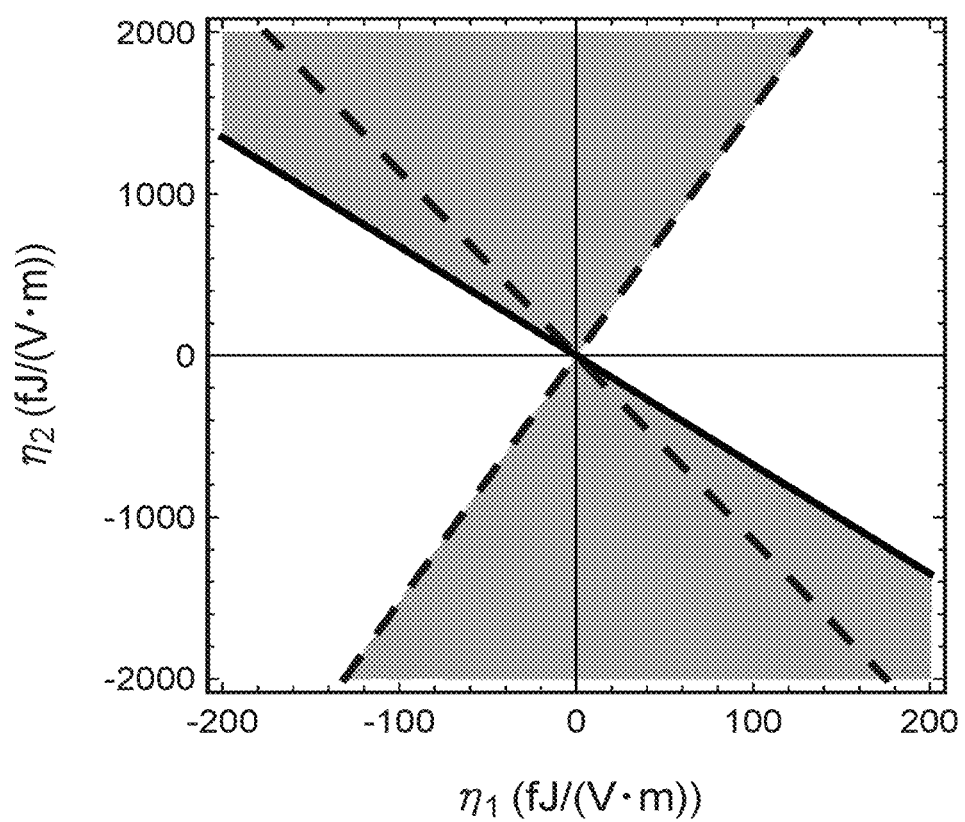
FIG. 11 is a phase diagram illustrating an example of a switching condition.

FIG. 11 is a phase diagram illustrating an example of a switching condition.

In FIG. 11, the horizontal axis is the field effect $\eta_1$ for $K_{u1}$; and the vertical axis is the field effect $\eta_2$ for $K_{u2}$. In FIG. 11, the gray regions illustrate the regions where processional switching occurs; and the white regions illustrate the regions where processional switching does not occur. In FIG. 11, the broken lines illustrate $(\eta_1, \eta_2)$ where D=0. D can be represented using the following "Formula 7" and "Formula 8." In "Formula 7" and "Formula 8," $K_{u1}$ and $K_{u2}$ are the anisotropy constants of the threshold electric field $E_c$ determined using "Formula 5." Also, in FIG. 11, the solid line illustrates the following "Formula 9."

$$D = \left[\frac{1}{2}\mu_0 M_s^2 (N_z - N_y) - K_{u1} - 2K_{u2}\right]^2 - \quad \text{[Formula 7]}$$

$$4K_{u2}\left[\frac{1}{2}\mu_0 M_s^2 N_y + K_{u1} + K_{u2} - \varepsilon_1\right]$$

$$\varepsilon_i = \frac{1}{2}\mu_0 M_s^2 \{N_x[1 - (m_z^{(0)})^2] + N_z(m_z^{(0)})^2\} + \quad \text{[Formula 8]}$$

$$K_{u1}[1 - (m_z^{(0)})^2] + K_{u2}[1 - (m_z^{(0)})^2]^2$$

$$\eta_2 = \eta_1 \frac{K_{u2}^{(0)}}{K_{1,\textit{eff}}^{(0)}} \quad \text{[Formula 9]}$$

From "Formula 7" to "Formula 9" and FIG. 11, it can be seen that processional switching occurs if the contour curve of an energy $\varepsilon_i$ that passes through the initial magnetization state does not reach $m_x = 0$ at the threshold voltage. To satisfy this condition, for example, it is sufficient for D<0. As described above, compared to other switching, the reversal speed of processional switching is fast; furthermore, it is favorable for $\eta_1$ and $\eta_2$ to be set to be included in the gray regions illustrated in FIG. 11 to stably obtain successful switching for the voltage application of a constant pulse width.

The write stability can be improved not only by setting $\eta_1$ and $\eta_2$ but also by setting $\theta_0$. From "Formula 9," it can be seen that as $K_{u2}^{(0)}$ decreases, the absolute value of the slope of the solid line of FIG. 11 decreases and the gray regions widen. It can be seen from FIG. 5 that a small $K_{u2}^{(0)}$ corresponds to $\theta_0$ approaching 90°. From calculations using "Formula 7" and "Formula 8" as well, results are obtained in which as $\theta_0$ approaches 90°, the absolute value of the slope of the broken line of FIG. 11 decreases and the gray regions widen. Also, even in the case where $K_{u1}$ and $K_{u2}$ do not change linearly with respect to the electric field E, processional switching occurs in a wider ($K_{u1}$, $K_{u2}$) range as $\theta_0$ approaches 90°. Accordingly, as $\theta_0$ approaches 90°, processional switching occurs easily; and stable writing is possible.

Although specific examples of the first magnetic layer 11 are described above, the third magnetic layer 13 may have similar characteristics.

Operational Example

Operational examples of the magnetic memory device according to the embodiment will now be described.

Figure 12A:
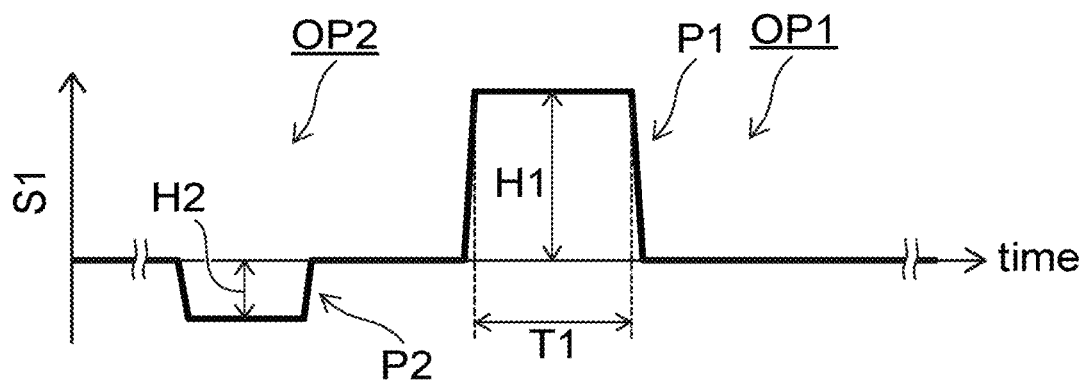
FIG. 12A to FIG. 12C are schematic views illustrating operations of the magnetic memory device according to the embodiment.
Figure 12B:
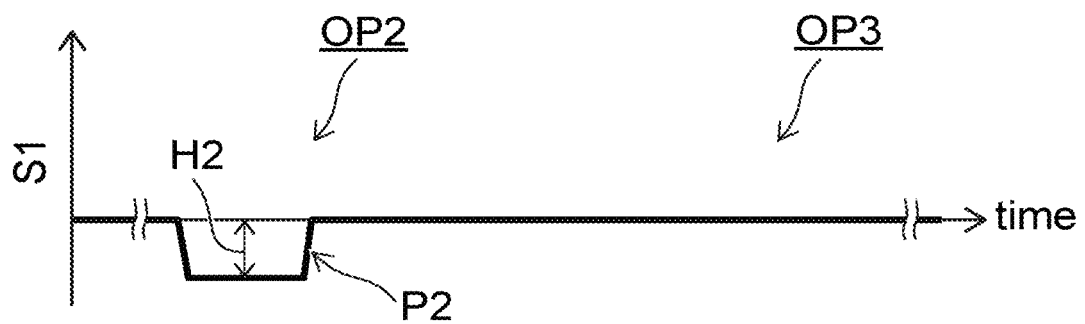
Figure 12C:
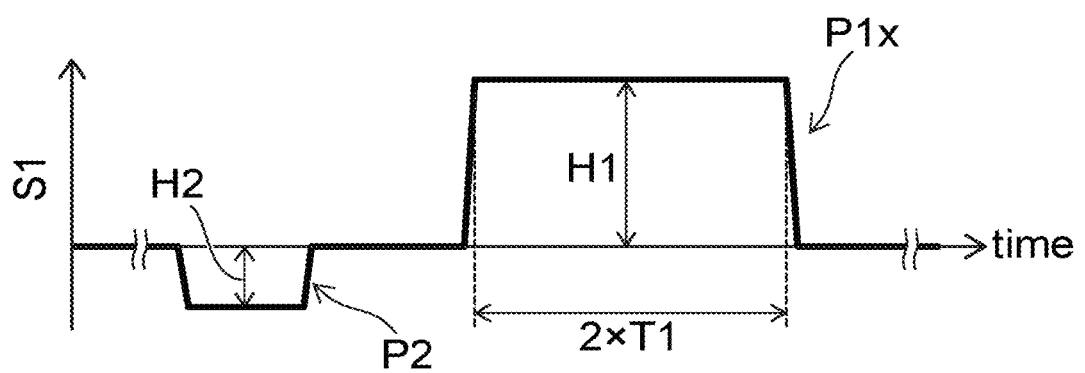

FIG. 12A to FIG. 12C are schematic views illustrating operations of the magnetic memory device according to the embodiment.

In these figures, the horizontal axis is time. In these figures, the vertical axis is the potential of a signal S1 applied between the first interconnect 71 and the second interconnect 72. The signal S1 substantially corresponds to a signal applied between the first magnetic layer 11 and the second magnetic layer 12 or between the third magnetic layer 13 and the fourth magnetic layer 14.

As illustrated in FIG. 12A, the controller 70 performs a first operation OP1 of applying a first pulse P1 (e.g., a rewrite pulse) between the first interconnect 71 and the second interconnect 72. In the first operation OP1, the first pulse P1 is supplied between the first magnetic layer 11 and the second magnetic layer 12. For example, the stored information is rewritten by the first pulse P1. The electrical resistance between the first magnetic layer 11 and the second magnetic layer 12 changes thereby.

For example, a second electrical resistance between the first magnetic layer 11 and the second magnetic layer 12 after the first operation OP1 is different from a first electrical resistance between the first magnetic layer 11 and the second magnetic layer 12 before the first operation OP1.

For example, the change of the electrical resistance is based on the change of the magnetization direction of the first magnetic layer 11 due to the first pulse P1 (the rewrite pulse). The relative relationship of the magnetization direction between the first magnetic layer 11 and the second magnetic layer 12 changes due to the first pulse P1 (the rewrite pulse). Multiple states that have different electrical resistances correspond respectively to the stored information.

As shown in FIG. 12A, the controller 70 may further perform a second operation OP2. In the second operation OP2, the controller 70 applies a second pulse P2 (a read pulse) between the first magnetic layer 11 and the second magnetic layer 12 (between the first interconnect 71 and the second interconnect 72) before the first operation OP1. A third electrical resistance between the first magnetic layer 11 and the second magnetic layer 12 obtained using the read pulse is different from the second electrical resistance between the first magnetic layer 11 and the second magnetic layer 12 after the first operation. The third electrical resistance is the electrical resistance before the rewriting. The second electrical resistance is the electrical resistance after the rewriting. For example, the third electrical resistance is the same as the first electrical resistance.

For example, the polarity of the second pulse P2 (the read pulse) is the reverse of the polarity of the first pulse P1 (the rewrite pulse). In the case where the second pulse P2 (the read pulse) having such a reverse polarity is used, the absolute value of a second pulse height H2 of the second pulse P2 may be less than, may be the same as, or may be larger than the absolute value of a first pulse height H1 of the first pulse P1 (the rewrite pulse). In the case where the magnetic anisotropy of the magnetic layer is controlled by a voltage, the change of the magnetization direction of the magnetic layer during reading can be suppressed by using a read pulse of the reverse polarity.

The case where the magnetic memory device 210 has the characteristics recited above is as follows.

In the first operation OP1, the controller 70 applies the first pulse P1 between the first magnetic layer 11 and the second magnetic layer 12. The second electrical resistance between the first magnetic layer 11 and the second magnetic layer 12 after the first operation OP1 is different from the first electrical resistance between the first magnetic layer 11 and the second magnetic layer 12 before the first operation OP1. The first pulse P1 has a first polarity, a first pulse width T1, and the first pulse height H1.

At this time, the case of applying another pulse having a second polarity that is the reverse of the first polarity, the first pulse width T1, and a pulse height having the same absolute value as the first pulse height H1 is as follows.

The absolute value of the difference between the third electrical resistance between the first magnetic layer 11 and the second magnetic layer 12 after the other pulse is applied between the first magnetic layer 11 and the second magnetic layer 12 and a fourth electrical resistance before the other pulse is applied between the first magnetic layer 11 and the second magnetic layer 12 is less than the absolute value of the difference between the second electrical resistance and the first electrical resistance. In other words, the rewriting of the information is performed by the application of the first pulse P1; and the rewriting of the information does not occur due to the application of the other pulse.

The electrical resistance between the first magnetic layer 11 and the second magnetic layer 12 corresponds to the electrical resistance between the first interconnect 71 electrically connected to the first magnetic layer 11 and the second interconnect 72 electrically connected to the second magnetic layer 12.

When the stored information should be maintained, the controller 70 performs a third operation OP3 after the second operation OP2 as shown in FIG. 12B. The first pulse P1 recited above is not applied in the third operation OP3. At this time, the rewriting does not occur.

The rewriting of the information is possible when the appropriate first pulse P1 is applied. When the appropriate first pulse P1 is applied, the electrical resistance between the first magnetic layer 11 and the second magnetic layer 12 changes from the high resistance state to the low resistance state or from the low resistance state to the high resistance state. On the other hand, in the case where an inappropriate pulse is applied, the high resistance state does not become the desired low resistance state. In the case where an inappropriate pulse is applied, the low resistance state does not become the desired high resistance state.

The pulse width of the inappropriate pulse is, for example, about 2 times the appropriate first pulse width Ti. In the case where the inappropriate pulse is applied between the first magnetic layer 11 and the second magnetic layer 12, the probability of the resistance change occurring is low.

For example, in the first operation OP1, the controller 70 applies the first pulse P1 recited above between the first magnetic layer 11 and the second magnetic layer 12. The first pulse P1 has the first pulse width T1 and the first pulse height H1. The rewriting is performed appropriately by the first pulse P1. In other words, the second electrical resistance between the first magnetic layer 11 and the second magnetic layer 12 after the first operation OP1 is different from the first electrical resistance between the first magnetic layer 11 and the second magnetic layer 12 before the first operation OP1. In such a case, when another pulse P1x such as that shown in FIG. 12C is applied, the change of the electrical resistance substantially does not occur. The other pulse P1x has the first pulse height H1 and a pulse width that is 2 times the first pulse width T1.

The absolute value of the difference between the third electrical resistance between the first magnetic layer 11 and the second magnetic layer 12 after such an other another pulse P1x is applied between the first magnetic layer 11 and the second magnetic layer 12 and the fourth electrical resistance before the other pulse P1x is applied between the first magnetic layer 11 and the second magnetic layer 12 is less than the absolute value of the difference between the second electrical resistance and the first electrical resistance. In other words, when the other pulse P1x is applied, the electrical resistance substantially does not change. Or, the change of the electrical resistance when the other pulse P1x is applied is smaller than the change of the electrical resistance when the first pulse P1 is applied.

The change of the electrical resistance recited above can be compared more reliably by using the average value of the resistance change over the operations of multiple times. For example, the process of applying the first pulse P1 recited above and detecting the change of the electrical resistance before and after is performed multiple times. The average value of the absolute values of the change of the electrical resistance in such a case is determined. On the other hand, a process of applying the other pulse P1x recited above and detecting the change of the electrical resistance before and after is performed multiple times. The average value of the absolute values of the change of the electrical resistance in such a case is determined. By comparing the two average values recited above, it can be seen more reliably that the change of the electrical resistance when the other pulse P1x is applied is smaller than the change of the electrical resistance when the first pulse P1 is applied.

In the magnetic memory device 210 according to the embodiment, for example, the change of the electrical resistance when the other pulse P1x recited above is applied is smaller than the change of the electrical resistance when the first pulse P1 recited above is applied.

According to the embodiments described above, a magnetic memory device can be provided in which the operational stability is improved.

The embodiments may include the following configurations (proposals).

Configuration 1

A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer,
a resistance·area of the first nonmagnetic layer being 10 $\Omega \cdot \mu m^2$ or more.

Configuration 2

A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer,
bidirectional information writing being performed by applying a unipolar voltage to the first magnetic layer via the first nonmagnetic layer.

Configuration 3

A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer,
a resistance·area of the first nonmagnetic layer being 10 $\Omega \cdot \mu m^2$ or more,
bidirectional information writing being performed by applying a unipolar voltage to the first magnetic layer via the first nonmagnetic layer.

Configuration 4

The magnetic element according to any one of Configurations 1 to 3, wherein an anisotropic magnetic field $H_k$ of the first magnetic layer in a plane crossing the first direction satisfies $H_k \neq 0$.

Configuration 5

The magnetic element according to any one of Configurations 1 to 4, wherein the first nonmagnetic layer is a tunnel insulating layer.

Configuration 6

The magnetic element according to any one of Configurations 1 to 5, wherein the first nonmagnetic layer includes an oxide, a nitride, or a fluoride including at least one selected from the group consisting of Mg, Si, Al, Ti, Zr, Hf, Ta, Zn, Sr, and Ba.

Configuration 7

The magnetic element according to any one of Configurations 1 to 6, further comprising a second magnetic layer provided at a side opposite to the first magnetic layer with the first nonmagnetic layer interposed.

Configuration 8

The magnetic element according to any one of Configurations 1 to 7, wherein the first magnetic layer has a cone magnetization state.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as first magnetic layers, first nonmagnetic layers, second magnetic layers, third magnetic layers, second nonmagnetic layers, fourth magnetic layers, first conductive layers, second conductive layers, third conductive layers, fourth magnetic layers, insulating portions, controllers, first interconnects, second interconnects, first switches, second switches, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

REFERENCE NUMERAL LIST 11 first magnetic layer
12 second magnetic layer
13 third magnetic layer
14 fourth magnetic layer
21 first nonmagnetic layer
22 second nonmagnetic layer
31 first conductive layer
32 second conductive layer
33 third conductive layer
34 fourth conductive layer
40 insulating portion
70 controller
71 first interconnect
72 second interconnect
72a first switch
72b second switch
110 first magnetic element
120 second magnetic element
210 magnetic memory device
m magnetization direction, m

The invention claimed is:

1. A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer,
a resistance·area of the first nonmagnetic layer being 10 $\Omega \cdot \mu^2$ or more.

2. The magnetic element according to claim 1, wherein an anisotropic magnetic field $H_k$ of the first magnetic layer in a plane crossing the first direction satisfies $H_k \neq 0$.

3. The magnetic element according to claim 1, wherein the first nonmagnetic layer is a tunnel insulating layer.

4. The magnetic element according to claim 1, wherein the first nonmagnetic layer includes an oxide, a nitride, or a fluoride including at least one selected from the group consisting of Mg, Si, Al, Ti, Zr, Hf, Ta, Zn, Sr, and Ba.

5. The magnetic element according to claim 1, further comprising a second magnetic layer provided at a side opposite to the first magnetic layer with the first nonmagnetic layer interposed.

6. The magnetic element according to claim 1, wherein the first magnetic layer has a cone magnetization state.

7. The magnetic element according to claim 1, wherein the first magnetic layer is formed of a ferromagnetic material having a c-axis aligned with the first direction.

8. The magnetic element according to claim 1, wherein the first nonmagnetic layer has a planar upper surface and the first direction is normal to the upper surface.

9. A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer, wherein
the first nonmagnetic layer has a planar upper surface,
the first direction is substantially normal to the upper surface, and
bidirectional information writing is performed by applying a unipolar voltage to the first magnetic layer via the first nonmagnetic layer.

10. The magnetic element according to claim 9, wherein the first magnetic layer is formed of a ferromagnetic material having a c-axis aligned with the first direction.

11. The magnetic element according to claim 9, wherein an anisotropic magnetic field $H_k$ of the first magnetic layer in a plane crossing the first direction satisfies $H_k \neq 0$.

12. A magnetic element, comprising:
a first magnetic layer; and
a first nonmagnetic layer,
an angle $\theta_0$ between a first direction and a magnetization direction of the first magnetic layer satisfying $0°<\theta_0<90°$ or $90°<\theta_0<180°$ in a state in which neither a voltage nor a magnetic field is substantially applied to the first magnetic layer, the first direction being from the first nonmagnetic layer toward the first magnetic layer,
a resistance·area of the first nonmagnetic layer being 10 $\Omega \cdot \mu m^2$ or more,
bidirectional information writing being performed by applying a unipolar voltage to the first magnetic layer via the first nonmagnetic layer.

13. The magnetic element according to claim 12, wherein the first magnetic layer is formed of a ferromagnetic material having a c-axis aligned with the first direction.

14. The magnetic element according to claim 12, wherein the first nonmagnetic layer has a planar upper surface and the first direction is normal to the upper surface.

15. The magnetic element according to claim 12, wherein an anisotropic magnetic field $H_k$ of the first magnetic layer in a plane crossing the first direction satisfies $H_k \neq 0$.

* * * * *